（12） United States Patent
Englekirk

(10) Patent No.: US 9,705,482 B1
(45) Date of Patent: Jul. 11, 2017

(54) HIGH VOLTAGE INPUT BUFFER

(71) Applicant: Peregrine Semiconductor Corporation, San Diego, CA (US)

(72) Inventor: Robert Mark Englekirk, Pacific Palisades, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 15/192,793

(22) Filed: Jun. 24, 2016

(51) Int. Cl.
| H03K 3/00 | (2006.01) |
| H03K 5/08 | (2006.01) |
| H03K 3/037 | (2006.01) |
| H03K 17/687 | (2006.01) |

(52) U.S. Cl.
CPC ............. H03K 5/08 (2013.01); H03K 3/0377 (2013.01); H03K 17/6871 (2013.01)

(58) Field of Classification Search
None
See application file for complete search history.

(56) References Cited

U.S. PATENT DOCUMENTS

| 3,699,359 | A | 10/1972 | Shelby |
| 5,012,123 | A | 4/1991 | Ayasli et al. |
| 5,313,083 | A | 5/1994 | Schindler |
| 5,373,294 | A | 12/1994 | Sun |
| 5,416,043 | A | 5/1995 | Burgener et al. |
| 5,463,394 | A | 10/1995 | Sun |
| 5,492,857 | A | 2/1996 | Reedy et al. |
| 5,495,436 | A | 2/1996 | Callahan |
| 5,548,239 | A | 8/1996 | Kohama |
| 5,553,295 | A | 9/1996 | Pantelakis et al. |
| 5,572,040 | A | 11/1996 | Reedy et al. |
| 5,596,205 | A | 1/1997 | Reedy et al. |
| 5,600,169 | A | 2/1997 | Burgener et al. |
| 5,663,570 | A | 9/1997 | Reedy et al. |
| 5,777,530 | A | 7/1998 | Nakatuka |
| 5,793,592 | A * | 8/1998 | Adams ................. H03K 17/162 361/111 |
| 5,801,577 | A | 9/1998 | Tailliet |
| 5,861,336 | A | 1/1999 | Reedy et al. |
| 5,863,823 | A | 1/1999 | Burgener |

(Continued)

OTHER PUBLICATIONS

Tieu, Binh Kien, Notice of Allowance received from the USPTO dated Nov. 17, 2008 for U.S. Appl. No. 11/127,520, 14 pgs.

(Continued)

*Primary Examiner* — Lincoln Donovan
*Assistant Examiner* — Khareem E Almo
(74) *Attorney, Agent, or Firm* — Jaquez Land Greenhaus LLP; Martin J. Jaquez, Esq.; Alessandro Steinfl, Esq.

(57) ABSTRACT

A high voltage input buffer having a first transistor having a first drain, a first source and a first gate configured to receive an input signal and a second transistor having a second drain, a second source and a second gate, wherein the second source is coupled to the first source to form an output, the second gate is coupled to the first drain and the second drain is coupled to the first gate and wherein when the input signal is less than a high voltage power on the first drain an output signal at the output follows the input signal and when the input signal is greater than the high voltage power on the first drain the output follows the high voltage power and a hysteretic circuit adapted to receive the output signal.

2 Claims, 8 Drawing Sheets

(56) References Cited

U.S. PATENT DOCUMENTS

| | | | |
|---|---|---|---|
| 5,883,396 A | 3/1999 | Reedy et al. | |
| 5,895,957 A | 4/1999 | Reedy et al. | |
| 5,920,233 A | 7/1999 | Denny | |
| 5,930,638 A | 7/1999 | Reedy et al. | |
| 5,945,867 A | 8/1999 | Uda et al. | |
| 5,973,363 A | 10/1999 | Staab et al. | |
| 5,973,382 A | 10/1999 | Burgener et al. | |
| 6,057,555 A | 5/2000 | Reedy et al. | |
| 6,066,993 A | 5/2000 | Yamamoto et al. | |
| 6,075,353 A | 6/2000 | Johnson et al. | |
| 6,466,489 B1 | 10/2002 | Ieong et al. | |
| 6,642,578 B1 | 11/2003 | Arnold et al. | |
| 6,775,112 B1 | 8/2004 | Smith et al. | |
| 6,798,629 B1 * | 9/2004 | Proebsting | H01L 27/0266 361/111 |
| 6,985,005 B1 * | 1/2006 | Kim | H03F 3/45179 326/21 |
| 7,196,547 B2 * | 3/2007 | Kozawa | H03K 3/3565 326/68 |
| 7,504,867 B2 * | 3/2009 | Choi | H03K 3/0375 327/108 |
| 7,613,442 B1 | 11/2009 | Kelly et al. | |
| 8,236,631 B2 * | 8/2012 | Afentakis | H01L 29/78624 257/365 |
| 8,643,407 B2 * | 2/2014 | Reese | H03K 3/0315 327/108 |
| 8,797,026 B2 * | 8/2014 | Kilian | H03K 19/18 324/117 H |
| 8,901,991 B2 * | 12/2014 | Zanetta | H03K 17/693 307/80 |
| 9,306,550 B2 * | 4/2016 | Kumar | H03K 3/3565 |
| 2006/0232313 A1 * | 10/2006 | Favard | H03K 3/3565 327/205 |
| 2009/0002905 A1 * | 1/2009 | Ramakrishna | H03K 19/00315 361/90 |
| 2013/0009674 A1 * | 1/2013 | Reese | H03K 3/0315 327/109 |
| 2014/0103894 A1 * | 4/2014 | McJimsey | G05F 1/67 323/282 |
| 2014/0320179 A1 * | 10/2014 | Lin | H03K 17/223 327/142 |

OTHER PUBLICATIONS

Kelly, et al, Declaration in Accordance with 37 CFR 1.68 filed in the USPTO dated Dec. 5, 2008 for U.S. Appl. No. 11/127,520, 6 pgs.

Tieu, Binh Kien, Notice of Allowance received from the USPTO dated Dec. 19, 2009 for U.S. Appl. No. 11/127,520, 7 pgs.

Tieu, Binh Kien, Notice of Allowance received from the USPTO dated Jun. 11, 2009 for U.S. Appl. No. 11/127,520, 9 pgs.

Huang, "A 0.5 •m CMOS T/R Switch for 900-MHz Wireless Applications"; IEEE Journal of Solid-State Circuits, vol. 36, No. 3, Mar. 2001, pp. 486-492.22.

Tieu, Binh, Notice of Allowance received from USPTO for U.S. Appl. No. 10/922,135 dated Jun. 2, 2006, 5 pgs.

Miyajima, Ikumi, Notice of Reasons for Refusal received from the Japanese Patent Office dated Feb. 13, 2006 for appln. No. 2003-535287, 3 pgs.

Lauterbach, et al., "Charge Sharing Concept and New Clocking Scheme for Power Efficiency and Electromagnetic Emission Improvement of Boosted Charge Pumps", IEEE Journal of Solid-State Circuits, vol. 35, No. 5, May 2000, pp. 719-723.

Makioka, et al., "Super Self-Aligned GaAs RF Switch IC with 0.25 dB Extremely Low Insertion Loss for Mobile Communication Systems", IEEE Transactions on Electron Devices, vol. 48, No. 8, Aug. 2001, pp. 1510-1514.

* cited by examiner

HIGH VOLTAGE INPUT BUFFER

CROSS REFERENCE TO RELATED APPLICATIONS

The present application may be related to U.S. Pat. No. 7,613,442 entitled "Switching Circuit and Method of Switching Radio Frequency Signals", issued on Nov. 3, 2009, the disclosure of which is incorporated herein by reference in its entirety.

BACKGROUND (1) Technical Field

The present disclosure relates to an input buffer and more specifically to a high voltage input buffer.

(2) Background

Low voltage internal chip process technologies often interface with external circuits. The voltage states that are received from the external circuits may be unknown and may cause damage if the voltage exceeds the internal supply voltage powering the internal chip. Often to overcome this high voltage input, a current consuming voltage divider may be used to reduce the received external voltage so that it remains within bounds of the lower voltage internal chip. Voltage attenuators, such as a voltage divider, may consume power and current from an external driver, and if a low current is used to reduce power and loading, interface speeds may be reduced. Another potential issue may be the effect of slowly varying inputs which may induce chatter in processing the signal.

SUMMARY OF THE INVENTION

In an embodiment a high voltage input buffer having a first transistor having a first drain, a first source and a first gate configured to receive an input signal and a second transistor having a second drain, a second source and a second gate, wherein the second source is coupled to the first source to form an output, the second gate is coupled to the first drain and the second drain is coupled to the first gate and wherein when the input signal is less than a high voltage power on the first drain an output signal at the output follows the input signal and when the input signal is greater than the high voltage power on the first drain the output follows the high voltage power and a hysteretic circuit adapted to receive the output signal. Implementations are foreseen in complementary metal oxide semiconductors (CMOS) on silicon on insulator (SOI), silicon on sapphire (SOS) and bulk Si. While all three technologies support the current invention, fabrication in CMOS on SOI or SOS improves low power consumption, the ability to withstand high power signals during operation due to FET stacking, good linearity, and high frequency operation.

In an embodiment a high voltage input buffer having a first transistor having a first drain, a first source and a first gate and a second transistor having a second drain, a second source and a second gate configured to receive an input signal, wherein the second source is coupled to the first source, the second gate is coupled to the first drain and the second drain is coupled to the first gate and wherein when the input signal is greater than a low voltage power on the second drain an output signal at the output follows the input signal and when the input signal is less than the low voltage power on the second drain the output follows the low voltage power and a hysteretic circuit adapted to receive the output signal.

In an embodiment a method of buffering a high voltage input having receiving a high voltage power powering a first transistor and controlling a second transistor, receiving an input signal controlling the first transistor and powering the second transistor, combining an output of the first transistor and the second transistor and receiving the combined output by a hysteretic circuit.

In an embodiment a method of buffering a high voltage input having receiving a low voltage power powering a second transistor and controlling a first transistor, receiving an input signal powering the first transistor and controlling the second transistor, combining an output of the first transistor and the second transistor and receiving the combined output by a hysteretic circuit.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Figures 1A, 1B:
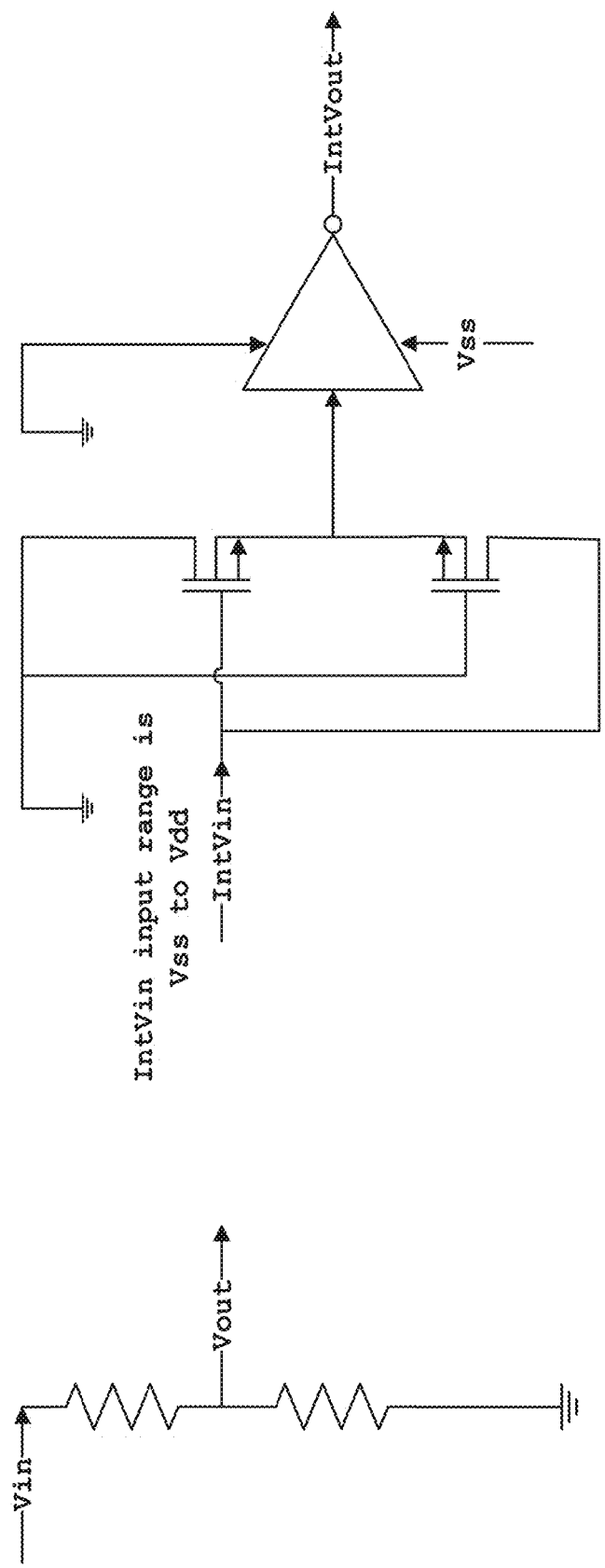
FIG. 1A-1B are examples of prior art.

In a common arrangement an external input voltage is reduced through a voltage divider before being passed to an internal circuit, as shown in FIG. 1A. Several problems may arise from this common arrangement such as size, input current and accuracy. Additionally, the input voltage would need to be specified in order to be able to set the resistors in the voltage divider.

FIG. 1A depicts a prior art voltage divider input circuit. One potential issue with this circuit is that the external input signal would need to be understood in order to set the values of the resistors, the input current is sinked to ground causing an input signal current loss and the on-chip size of the resistors are large. The voltage divider of FIG. 1A therefore has the potential problems of size and power consumption. Other implementations may include diode clamps and/or diode configured FETs.

FIG. 1B depicts an internal implementation of the circuit in which the drain of the upper input FET is tied to ground. This circuit was used internally to a chip where the internal input voltages are specified. Internal uses of the circuit select either Vss or Vdd for the input voltage, so there is no transitional region issue to contend with, the circuit is implemented in NMOS and has internal inputs of +3 v to −3 v but only permits outputs from −3 to 0 V (i.e., less than GND). The inputs to the circuit exceed the downstream inverter voltage power supply voltages. The circuit clips the voltage into the downstream inverter, thus preventing damage to the inverter. In an internal node the signals are specified and there is no need for hysteresis, since the ramp and rails of the signal are specified, there is minimal potential for chatter. It is this capacity, in addition to enabling positive output voltages as well as negative ones, modified and extended for use to unknown external inputs that the disclosure implements.

The prior art consists of two different types of clamping, one of which FIG. 1B has been used exclusively internally and only for negative output voltages and the other one FIG. 1A being used for external connections.

Current implementations now may include many more input signal types than may be efficiently handled with resistor dividers, diode clamps and/or diode configured FETs. A solution was needed in which the internal circuit of FIG. 1B was utilized as a generic input overvoltage clamp, one in which input current loss and on chip size may be minimized.

Currently, external input connections may have a voltage divider, a divider and a diode string clamp and/or diode connected field effect transistors (FETs) to drop the voltage of external input signals for use within a chip. Often external signals are unknown, which makes the design of the external interface problematic and possibly catastrophic to the chip if a large input voltage is seen at a connection bond pad.

Several terms will be used throughout the specification. Threshold voltage (Vt) is the minimum gate to source voltage necessary to form a conducting path in a field effect transistor (FET). High voltage power will be termed Vdd and low voltage power will be termed Vss. Vss may be either a negative voltage or ground (GND). An N-channel metal oxide semiconductor field effect transistor will be termed an NMOS FET. A P-channel metal oxide semiconductor field effect transistor will be termed a PMOS FET.

An unmodified (unconditioned) input signal will be termed Vin, and once the signal has been conditioned it will be termed Vinlv. Once the conditioned signal Vinlv is passed through a logic circuit, the output of the logic circuit is termed Vout. The conditioned signal Vinlv is a signal within the chip that would not do harm to the internal circuit.

Within circuit inputs will be termed IntVin and within circuit outputs will be termed IntVout. IntVin signals have specified limits.

The term process limit as used in this disclosure is the maximum voltage that any one device may tolerate over its proscribed lifetime at a given operating temperature. In essence, it is the voltage at which no harm will come to an internal on-chip device.

Some of the issues that the device of the instant disclosure may address are input of an unspecified, unconditioned signal without doing harm to a subsequent internal circuit that the input is passed onto; accurate conveyance of the input signal within the bounds which would not harm the circuit; reduction in power utilized in conditioning the signal and on-chip size requirements for input signal conditioning.

In an example of the proposed circuit, the external input signal may drive to a voltage as high as the process limit above the power supply voltage without consuming current. The circuit may provide minimal delay to the input, and pass un-attenuated the external input signal if it is at least one Vt below Vdd. In an embodiment, the external input signal may require hysteresis to mitigate the effects of a slowly varying external input signal and the circuit may be implemented in NMOS or in PMOS.

The circuit has two transistors that operate like a switch. The two transistors have a minimal layout area. In operation, when an input signal Vin has a voltage less than the high voltage power Vdd, then Vin is passed directly to the circuit as Vinlv. When the input signal Vin approximately exceeds the high voltage power Vdd, then the input signal Vin is coupled to the high voltage power Vdd and the conditioned signal Vinlv is clipped.

Since both transistors operate like a switch, the device may function most efficiently if both of the transistors are OFF in the transition region. A transition may occur in which the switches make a weak link to the conditioned signal Vinlv when Vin is in the range Vdd-Vt to Vdd+Vt. The device may function most efficiently if the ViH and ViL of the following circuit is outside this range.

Figure 2:
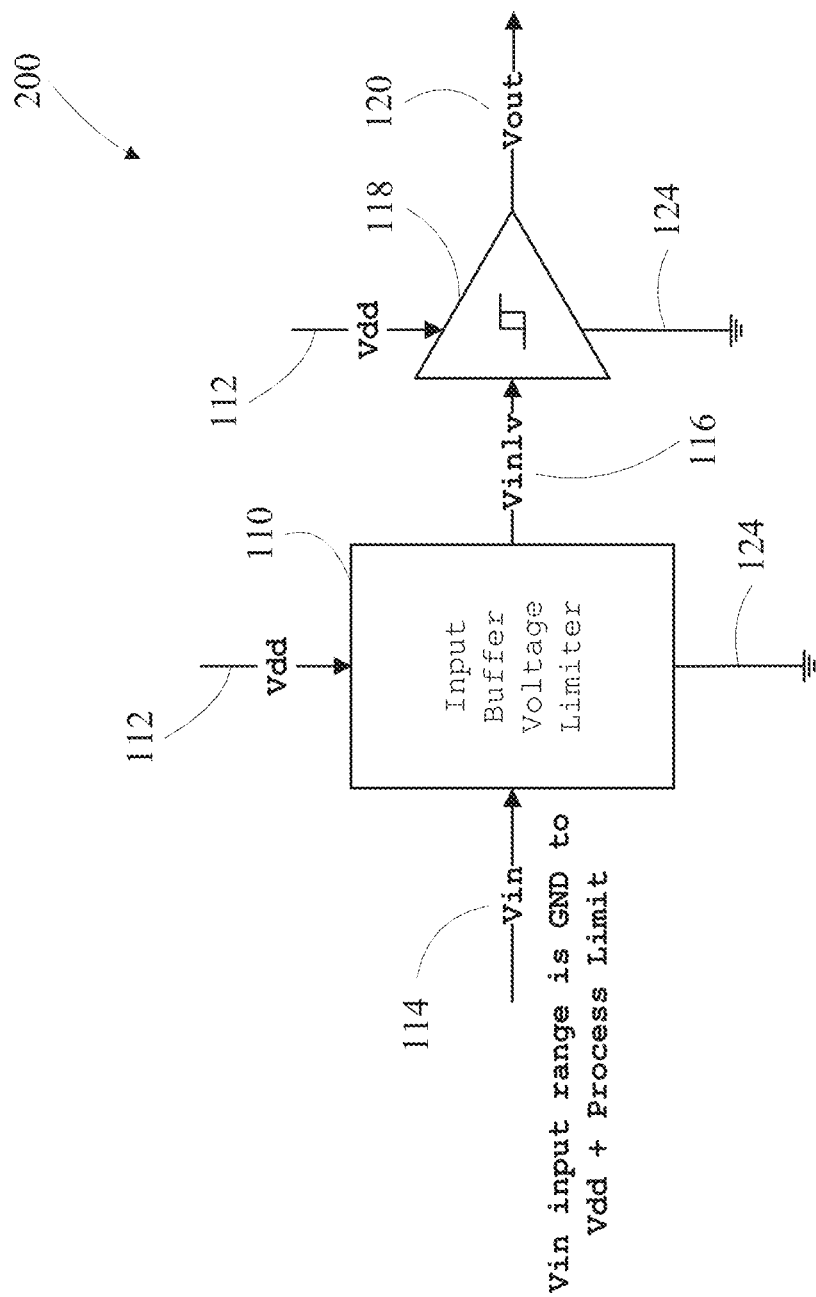
FIG. 2 is a first example system in accordance with one embodiment of the disclosure.

FIG. 2 depicts an overall example system having an input buffer voltage limiter 110 and a logic circuit 118, in this case a Schmitt trigger. The input buffer voltage limiter 110 has high voltage power Vdd 112 and ground 124, a high voltage input Vin 114 and a clipped input voltage of the conditioned signal Vinlv 116. The Schmitt trigger 118 has a high voltage power Vdd and a low voltage power Vss, its input is the conditioned signal Vinlv 116 and has an output signal Vout 120. The input voltage Vin range for this circuit is from ground GND to Vdd plus the process limit.

Figure 3:
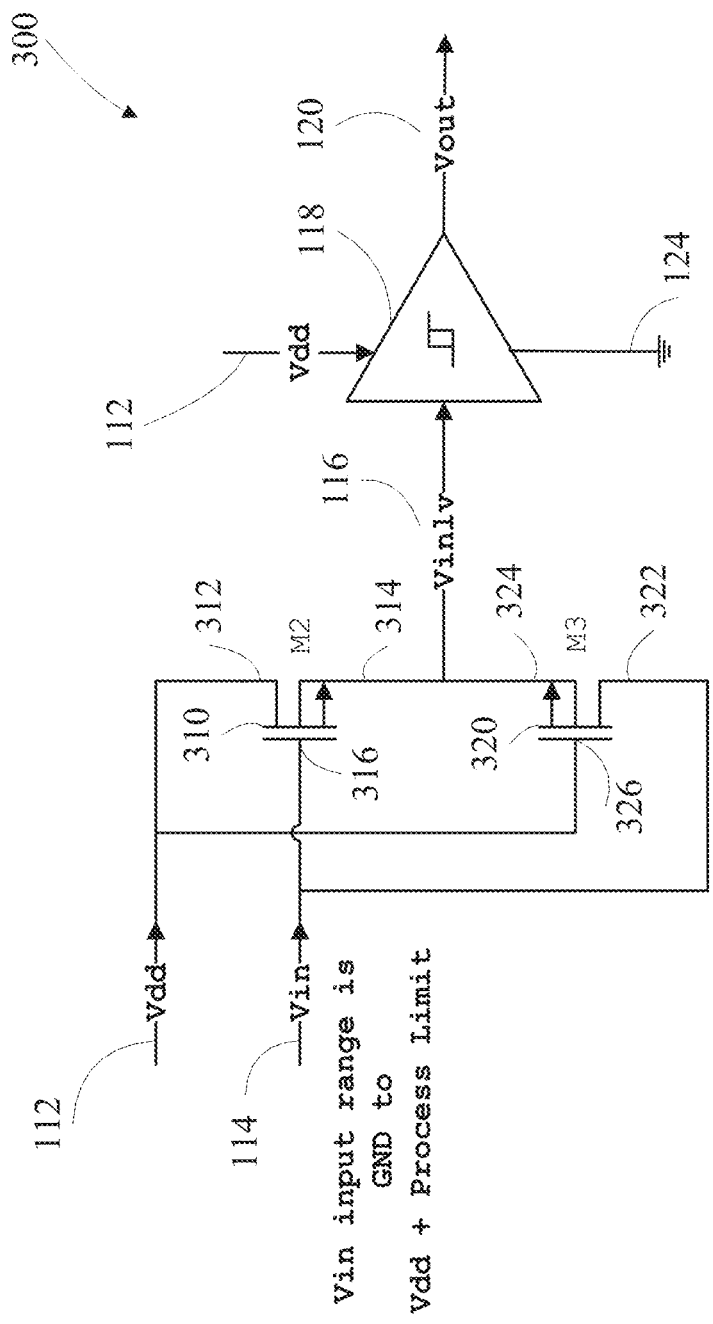
FIG. 3 is a second example system in accordance with one embodiment of the disclosure.

FIG. 3 depicts a second example of a high voltage input buffer. The input buffer voltage limiter has two interconnected transistors of the same type, in this example N type. In this example a first transistor 310 has a first drain 312, a first source 314 and a first gate 316. The first gate 316 is configured to receive an input signal 114, which may be high voltage and which is also coupled to a second transistor 320 second drain 322 to power the second transistor. The input voltage Vin range for this circuit is from ground GND to Vdd plus the process limit. The second transistor 320 has a second source 324 and a second gate 326. In this example the second source is coupled to the first source and forms a node that outputs the conditioned signal Vinlv 116.

The two switches M2 and M3 clamp the input so that it does not exceed the high voltage power Vdd. When the input is low, transistor M2 is OFF, M3 is ON and it is operating as a pass-thru switch such that Vinlv equals Vin. In the case where Vin is greater than Vdd, then M2 is ON and M3 if OFF, and the circuit then passes Vdd through to Vinlv instead of the input voltage. In the transitional region when Vin is within 1 NMOS Vt of Vdd the transistors are transitioning between the two states, and M2 and M3 are transitioning between ON and OFF which may cause increased leakage current until the ON voltage is established for one of the transistors. When Vin is equal to Vdd, M2 and M3 are OFF.

In an example embodiment different thresholds may be used for transistors M2 and M3. It is most efficient if M2 and/or M3 are OFF in the transitional state, since it is best not to have them ON at the same time. A high impedance state creates the possibility of some chatter which is a reason to couple a hysteretic logic circuit to the buffer that has a voltage threshold that is significantly away from the power voltage rail. M2 and M3 may have equal thresholds or one may have a Vt that is lower than a standard digital device so that ON voltages are offset.

If both transistors are not completely OFF in the transitional region some input current may leak into Vdd. One possible solution that this may provide is the elimination of noise or chatter in exchange for input current loss, resulting in potentially increased accuracy of transfer of the input signal to the conditioned signal.

Referring to FIG. 3, if the external input voltage is near Vdd (Vdd+/−Vt) transistors M2 and M3 are OFF at the same time, a high level may be presented to the input buffer which may be poorly controlled. This is remedied by hysteretic circuit 118, which ensures a stable Vout for all conditions of Vin.

Figure 4:
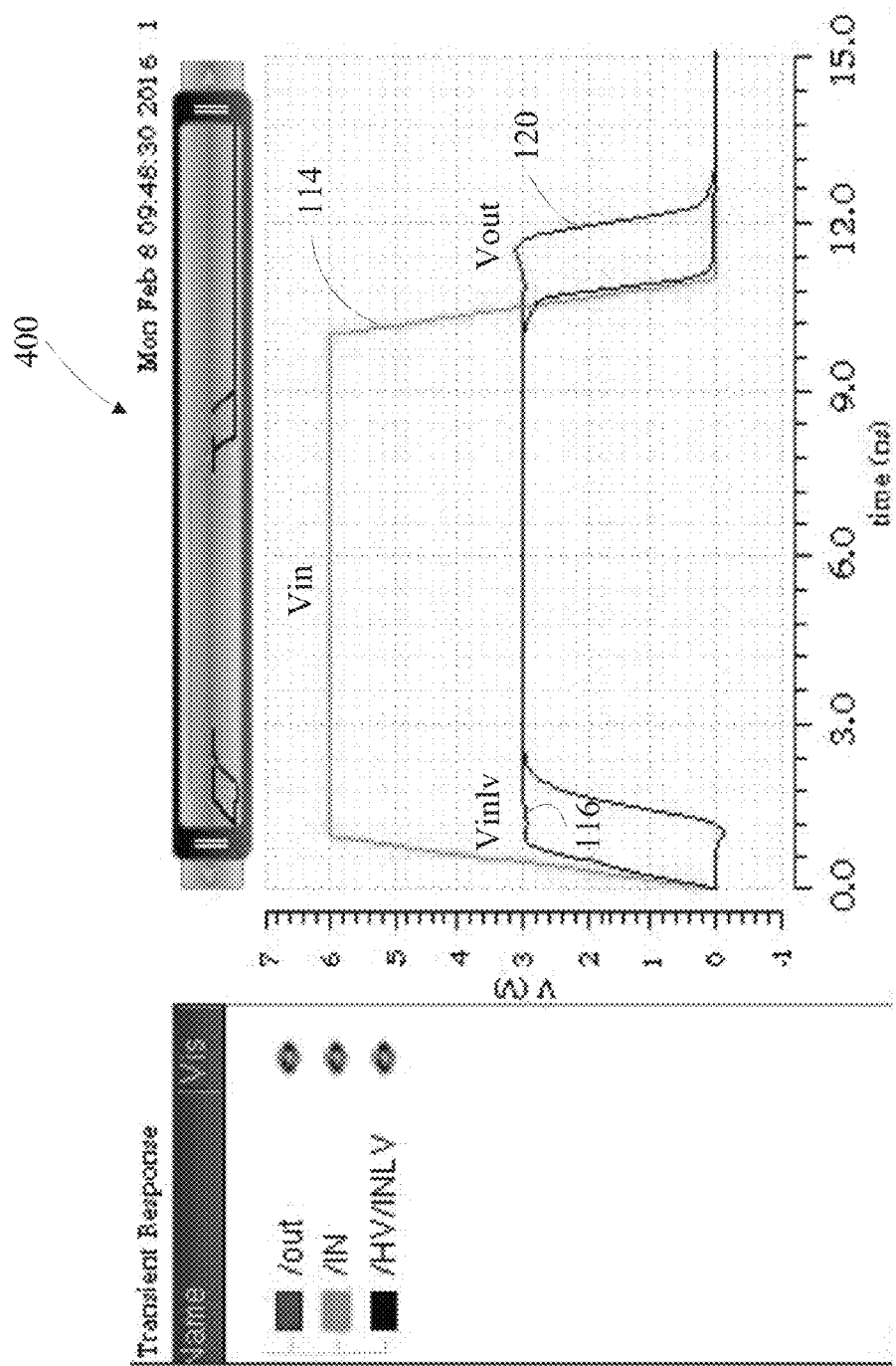
FIG. 4 is an example output of the second example system.

FIG. 4 depicts input signal Vin 114, conditioned signal Vinlv 116 and output signal Vout 120. The figure shows that the input signal Vin is clipped so that conditioned signal Vinlv may only go as high as Vdd (3V in this case).

Figure 5:
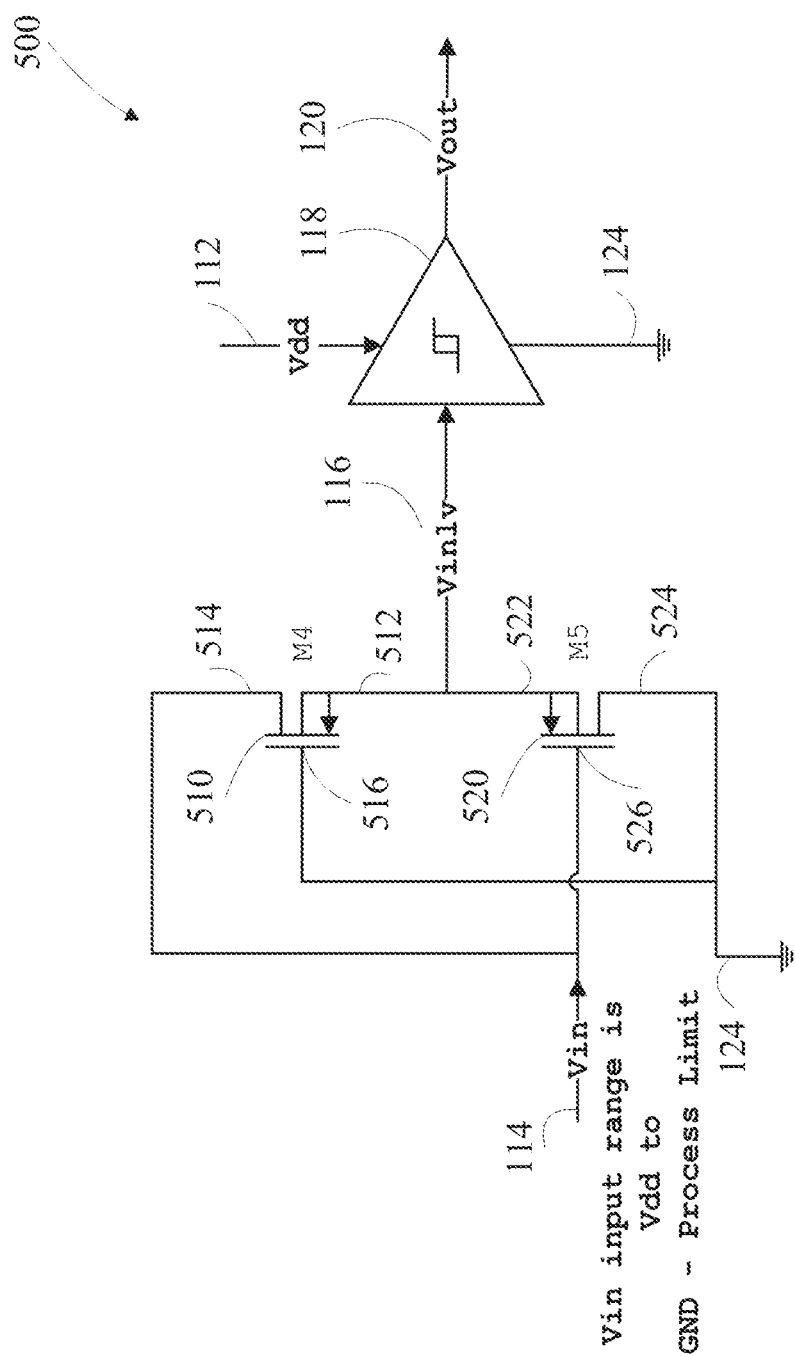
FIG. 5 is a third example system in accordance with one embodiment of the disclosure.

Similar circuitry may be designed with PMOS devices to allow the input signal to go from Vdd to ground GND minus the process limit as shown in FIG. 5.

The circuit may have series connected transistors having two sources coupled and having a power supply powering one transistor and controlling the second and an input signal powering the second transistor and controlling the first. By doing this, the output of the buffer is clipped to either the high or low voltage supply depending upon the circuit configuration.

FIG. 5 depicts a third example of a high voltage input buffer. The input buffer voltage limiter has two interconnected transistors of the same type, in this example P type. This embodiment has a first transistor 510 that has a first drain 514, a first source 512 and a first gate 516. The second transistor 520 has a second drain 524, a second source 522 and a second gate 526. An input signal 114 is coupled to the second gate 526 of the second transistor 520 and to the first drain 514 of the first transistor 510. The input voltage Vin range for this circuit is from Vdd to ground GND minus the process limit. The second source 522 is coupled to the first source 512 and the junction of the two sources yields the conditioned signal Vinlv 116. The second drain 524 is coupled to the first gate 516. The hysteretic circuit serves the same role as in FIG. 3 for excessively positive input signals and ensures stable Vout for all conditions of Vin.

Figure 6:
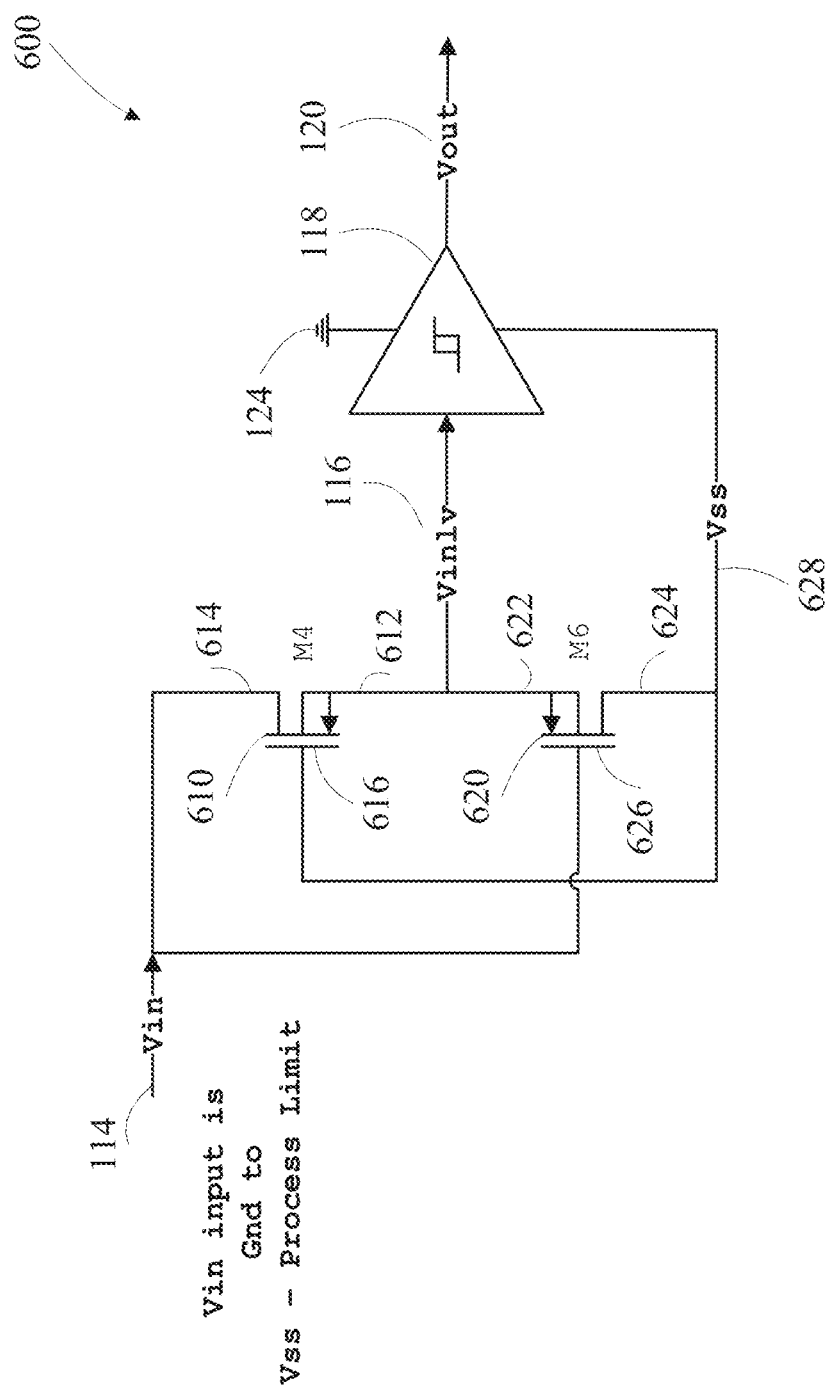
FIG. 6 is a fourth example system in accordance with one embodiment of the disclosure.

FIG. 6 depicts a fourth example of a high voltage input buffer and is similar to FIG. 5. The input buffer voltage limiter has two interconnected transistors of the same type, in this example P type. This embodiment has a first transistor 610 that has a first drain 614, a first source 612 and a first gate 616. The second transistor 620 has a second drain 624, a second source 622 and a second gate 626. An input signal 114 is coupled to the second gate 626 of the second transistor 620 and to the first drain 614 of the first transistor 610. The input voltage Vin for this circuit is from GND to Vss minus (−) the process limit. The second source 622 is coupled to the first source 612 and the junction of the two sources yields the conditioned signal Vinlv 116. The second drain 624 is coupled to the first gate 616 and to a hysteretic circuit 118. The hysteretic circuit has power connections to Vss 628 and ground 124. Vin 114 on the plus side is ground on the negative side is Vss minus (−) the process limit. In this example Vss is restricted to the process limit from ground. Ground could be any voltage above Vss.

Figure 7:
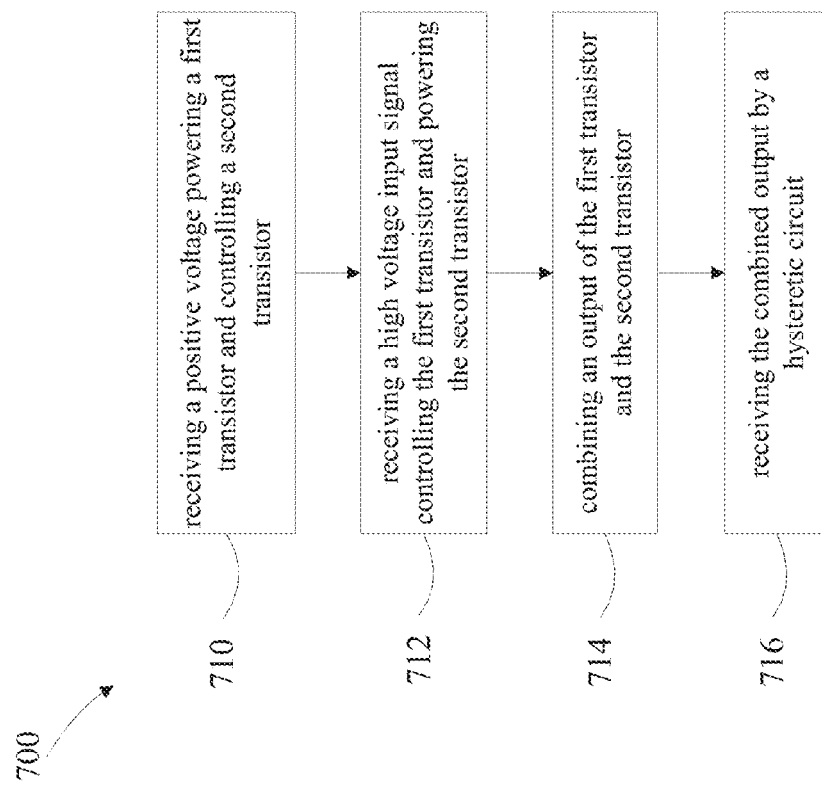
FIG. 7 is a first example method in accordance with one embodiment of the disclosure.

FIG. 7 depicts a first method of buffering a high voltage input having, receiving 710 a power input signal powering a first transistor and controlling a second transistor, receiving 712 a input signal controlling the first transistor and powering the second transistor, combining 714 an output of the first transistor and the second transistor and receiving 716 the combined output by a hysteretic circuit.

Figure 8:
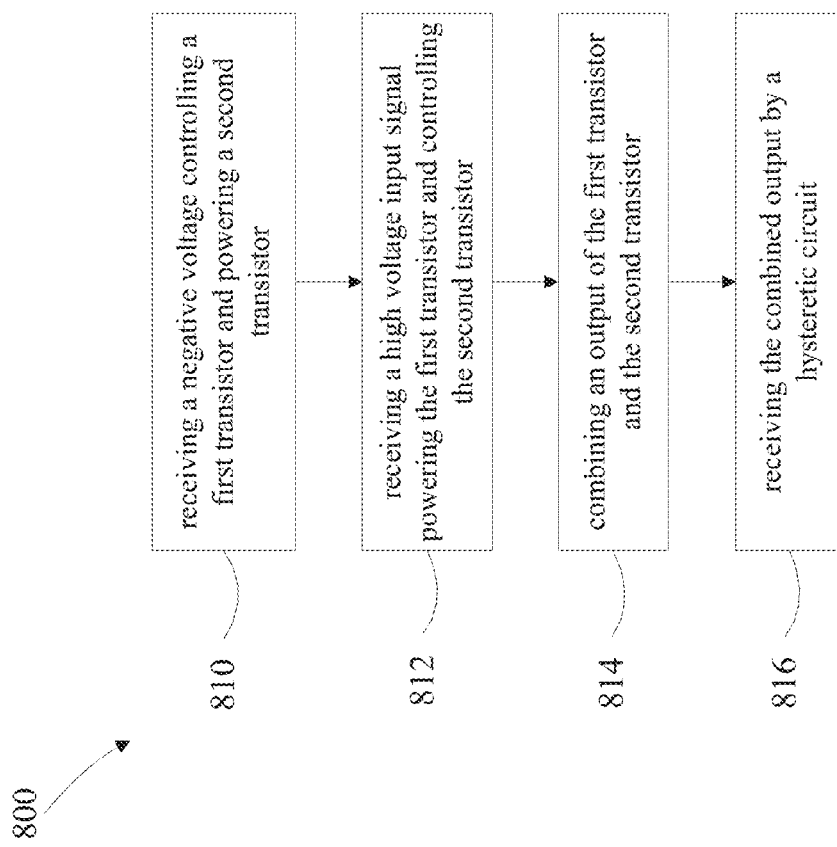
FIG. 8 is a second example method in accordance with one embodiment of the disclosure.

FIG. 8 depicts a second method of buffering a high voltage input having, receiving 810 a power input signal controlling a first transistor and powering a second transistor, receiving 812 a input signal powering the first transistor and controlling the second transistor, combining 814 an output of the first transistor and the second transistor and receiving 816 the combined output by a hysteretic circuit.

Fabrication Technologies and Options

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs pHEMT, GaAs HBT and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation. Monolithic IC implementation is particularly useful since parasitic capacitances generally can be kept low by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A method of buffering a high voltage input comprising:
   receiving a high voltage power powering a first transistor and controlling a second transistor;
   receiving an input signal controlling the first transistor and powering said second transistor;
   combining an output of said first transistor and said second transistor;
   receiving said combined output by a hysteretic circuit, and
   clipping said input signal to said high voltage power.

2. A method of buffering a high voltage input comprising:
   receiving a low voltage power powering a second transistor and controlling a first transistor;
   receiving an input signal powering the first transistor and controlling the second transistor;
   combining an output of said first transistor and said second transistor;
   receiving said combined output by a hysteretic circuit, and
   clipping said input signal to said low voltage power.

* * * * *